United States Patent
Wallisch et al.

(10) Patent No.: US 8,063,479 B2
(45) Date of Patent: Nov. 22, 2011

(54) HOUSING FOR A SEMICONDUCTOR COMPONENT

(75) Inventors: Thorsten Wallisch, Stuttgart (DE); Christian Solf, Karlsruhe (DE); Florian Grabmaier, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 136 days.

(21) Appl. No.: 12/460,567

(22) Filed: Jul. 20, 2009

(65) Prior Publication Data
US 2010/0019375 A1 Jan. 28, 2010

(30) Foreign Application Priority Data

Jul. 21, 2008 (DE) .......................... 10 2008 040 565

(51) Int. Cl.
*H01L 23/48* (2006.01)
*H01L 23/495* (2006.01)
(52) U.S. Cl. . 257/690; 257/666; 257/696; 257/E23.031; 257/E23.042; 257/E23.043

(58) Field of Classification Search .......... 257/666–676, 257/690–696, E23.031–E23.069; 438/123
See application file for complete search history.

(56) References Cited

U.S. PATENT DOCUMENTS
5,031,024 A * 7/1991 Kudo et al. .................. 257/791
* cited by examiner

*Primary Examiner* — Jasmine Clark
(74) *Attorney, Agent, or Firm* — Kenyon & Kenyon LLP

(57) ABSTRACT

A housing for a semiconductor component, in which the housing has a plurality of pins which are provided at the edge of the housing at distances, the pins each having a width, a thickness and a length. In order to create a housing for a semiconductor component whose characteristic frequencies are outside a range in which the characteristic frequencies of the housing negatively influence the semiconductor component, either at least one of the distances lies outside the range of 1.24 mm to 1.30 mm, at least one of the widths lies outside the range of 0.33 mm to 0.51 mm, at least one of the thicknesses lies outside the range of 0.23 to 0.32 mm, or at least one of the lengths lies outside the range of 2.05 to 4.12 mm.

17 Claims, 3 Drawing Sheets

HOUSING FOR A SEMICONDUCTOR COMPONENT

RELATED APPLICATION INFORMATION

The present application claims priority to and the benefit of German patent application no. 10 2008 040 565.5, which was filed in Germany on Jul. 21, 2008, the disclosure of which is incorporated herein by reference.

FIELD OF THE INVENTION

The present invention relates to a housing for a semiconductor component.

BACKGROUND INFORMATION

Such a housing for a semiconductor component has several pins provided at the edge of the housing at intervals, the pins each having a width, a thickness and a length. Certain dimensions of the housing, such as the width and the thickness of the pins are established by the JEDEC standard. The length of the pins is not stipulated, but comes about indirectly from the remaining dimensions. The housing and the pins form a vibratory system which has certain characteristic frequencies. These characteristic frequencies are established by the dimensions and additional parameters, such as the weight of the housing and the materials used. The semiconductor component accommodated in the housing includes a micromechanical acceleration sensor and an integrated circuit. The acceleration sensor has a seismic mass that is able to be excited to resonant vibration. These resonant vibrations considerably corrupt the measurements of the acceleration sensor.

One disadvantage is that the characteristic frequencies of the housing are able to be suitable for exciting the seismic mass to resonances, so that the measurements of the acceleration sensor are corrupted considerably. The characteristic frequencies are established by the dimensions, the weights and the materials of the housing and the springs. Since certain materials are required, or at least may be preferred, the weight comes about due to the materials and the dimensions, and the dimensions are established by the JEDEC standard, such corruptions cannot be removed for the standardized housing.

SUMMARY OF THE INVENTION

The exemplary embodiments and/or exemplary methods of the present invention is based on the object of creating a housing for a semiconductor component whose characteristic frequencies are outside a range in which the characteristic frequencies of the housing have a negative influence on the semiconductor component.

The object on which the exemplary embodiments and/or exemplary methods of the present invention is based is attained by a housing according to the description herein.

The exemplary embodiments and/or exemplary methods of the present invention relates to a housing for a semiconductor component, either at least one of the distances lying outside the range of 1.24 mm to 1.30 mm, at least one of the widths lying outside the range of 0.33 mm to 0.51 mm, at least one of the thicknesses lying outside the range of 0.23 to 0.32 mm, or at least one of the lengths lying outside the range of 2.05 to 4.12 mm, in order to establish suitable characteristic frequencies of the housing. The distances apart, the widths and the thicknesses are changed at most to the extent that the housing is still able to be handled using the usual devices. One may also change a plurality of these variables for a plurality of pins. Advantageously, additional measures for damping vibrations are not required.

In one exemplary embodiment, one of the widths is greater than 0.51 mm, which may be greater than 0.55 mm, 0.6 mm, 0.7 mm, 0.8 mm or 1.0 mm, and one of the thicknesses is greater than 0.32 mm, which may be greater than 0.35 mm, 0.4 mm, 0.5 mm, 0.6 mm, 0.8 mm, 1.0 mm or 1.2 mm. As large a deviation as possible leads to a corresponding change in the characteristic frequencies of the housing. If the widths and the thicknesses are changed in common, the characteristic frequencies of the housing are able to be increased as much as possible, the respective deviation from standard being minimized and the processing being simplified by usual devices.

In one refinement of the exemplary embodiment, one of the lengths is less than 2.05 mm, which may be less than 2.0 mm or 1.8 mm. The characteristic frequency of the housing may be increased still further.

In another refinement of the exemplary embodiment, one of the widths is the width of a broadened section, and one of the thicknesses is the thickness of a thickened section. The broadened section and the thickened section may be from a middle section having an enlarged cross section. Since the ends of the pin are furthermore able to correspond to the standard, the processing by usual devices and the integration of the pins into usual components is made easier.

In still another exemplary embodiment, one of the widths is less than 0.33 mm, which may be less than 0.3 mm, 0.25 mm, 0.2 mm, 0.1 mm or 0.05 mm, and one of the thicknesses is less than 0.23 mm, which may be less than 0.2 mm, which may be less than 0.15 mm, 0.1 mm, 0.05 mm. As large a deviation as possible again leads to a corresponding change in the characteristic frequencies of the housing. If the widths and the thicknesses are changed in common, the characteristic frequencies of the housing are able to be reduced as much as possible, the respective deviation from standard being minimized and the processing being simplified by usual devices.

In a further refinement of the last exemplary embodiment, one of the lengths is greater than 4.12 mm, which may be greater than 4.2 mm, 4.3 mm, 4.5 mm, 4.7 mm, 5.0 mm, 5.5 mm, 6.0 mm, 7.0 mm, 8.0 mm, 10.0 mm or 15 mm. The characteristic frequency of the housing may be decreased still further.

In still another refinement of the last exemplary embodiment, the pin which has one of the lengths has a middle bend. This makes it possible to develop the pin to be as long as possible. The pin may also have several arches that are situated zigzag-shaped.

In yet another refinement of the last exemplary embodiment, at a distance of 1.24 mm to 1.30 mm, no pin is provided on one side of the housing. If the distance apart of the pins is increased, and thus the number of pins is reduced, the characteristic frequencies are reduced further.

In yet another further refinement of the last exemplary embodiment, at a distance apart of 2.51 mm to 1.57 mm, one pin is provided on one side of the housing. Such a distance is compatible with the usual JEDEC standard, so that the processing by the usual devices and the integration of the pins into the usual components is simplified.

In yet another refinement of the last exemplary embodiment, one of the widths is the width of a narrowed section, and one of the thicknesses is the thickness of a thinned section. The narrowed section and the thinned section may form a middle section having a diminished cross section. Since the ends of the pin are furthermore able to correspond to the standard, the processing by usual devices and the integration of the pins into usual components is made easier.

In still one more exemplary embodiment, the pins are all developed the same. Because of this, the frequency change of the housing is optimized for a certain design approach path compared to the JEDEC standard.

In the following, the exemplary embodiments and/or exemplary methods of the present invention is described in greater detail with reference to the drawings.

DETAILED DESCRIPTION

Figure 1A:
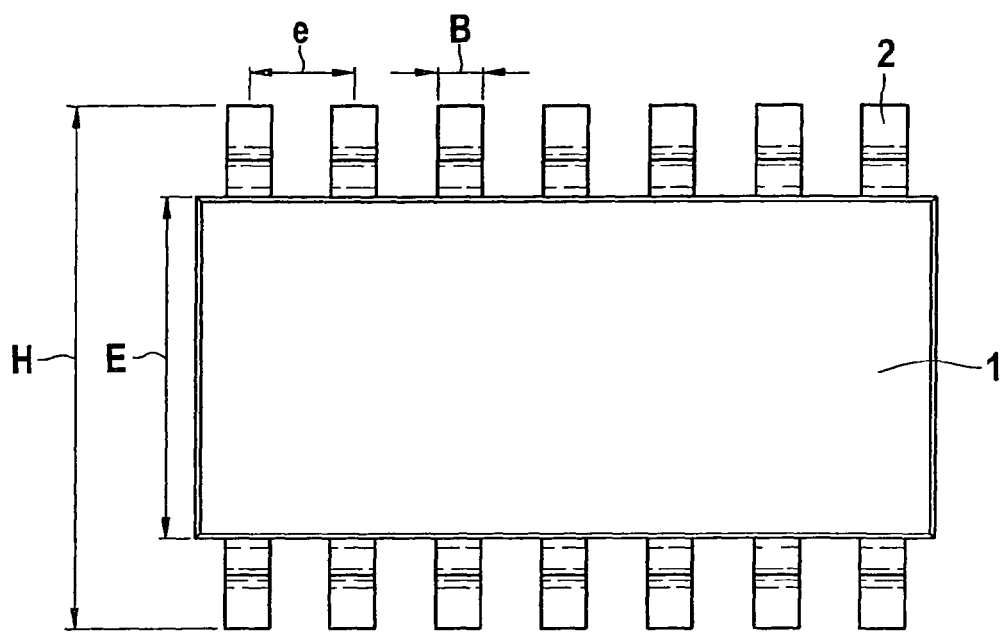
FIG. 1A shows a top view of a housing for a semiconductor component.

FIG. 1A shows a top view of a housing 1 for a semiconductor component. Housing 1 has a rectangular shape and is developed as a so-called SO16 housing. In housing 1 a semiconductor component is accommodated, which includes a micromechanical acceleration sensor and an integrated circuit, which are integrated on one chip. At two opposite long sides of the housing, two rows of pins protrude, having several pins 2, which are made of metal, which may be of copper. These pins are surface-mounted, that is, they are soldered onto the surface of a printed-circuit board. Housing 1 forms a mass which is connected to a subjacent printed-circuit board (not shown), via springs represented in each case by one of pins 2. The acceleration sensor has a seismic mass that is able to be excited to resonant vibration. This considerably corrupts the measurements of the acceleration sensor. Housing 1 and pins 2 also form a vibratory system. Housing 1 has a width E. The ends of the opposite pins have a distance apart of H which, according to the JEDEC standard, is supposed to be in the range of 10.00 mm to 10.65 mm.

According to the JEDEC standard, the distance (pitch) e between two adjacent pins is supposed to amount to 1.27 mm from the middle of one pin to the middle of the other pin. Width B of pins 2 is constant along the pins, and according to the JEDEC standard, is in a range of 0.33 mm to 0.51 mm. However, according to the exemplary embodiments and/or exemplary methods of the present invention, width B may be outside this range, in order to change the characteristic frequencies of the housing, with respect to the JEDEC standard. The characteristic frequencies of housing 1 are reduced when width B of pins 2 is narrowed. The characteristic frequencies of housing 1 are increased when width B of pins 2 is narrowed.

Figure 1B:
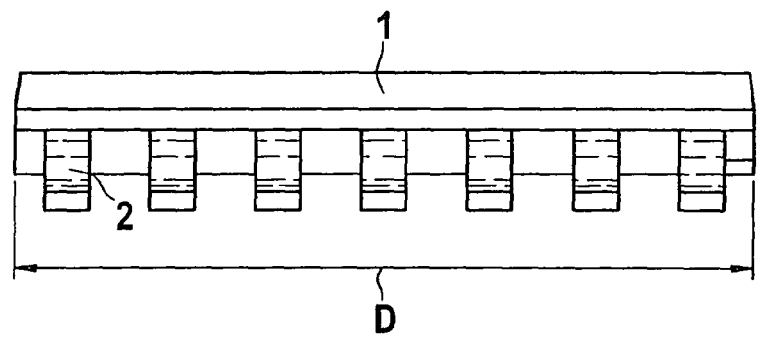
FIG. 1B shows a side view of the housing in FIG. 1A.

FIG. 1B shows a side view of housing 1 of FIG. 1A. Housing 1 has a length D.

Figure 1C:
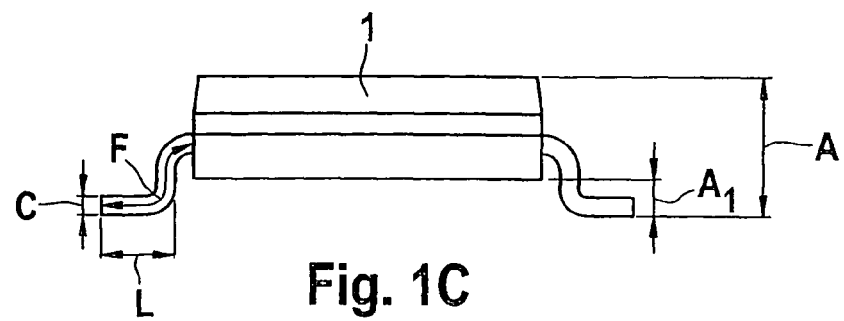
FIG. 1C shows another side view of the housing in FIG. 1A.

FIG. 1C shows an additional side view of housing 1 of FIG. 1A. Housing 1 has a thickness A, which, according to the JEDEC standard, is supposed to be in a range of 2.35 mm to 2.65 mm. The distance of the underside of the housing from the printed-circuit board amounts to $A_1$, and is supposed to be in a range of 0.1 to 0.3 mm, according to the JEDEC standard. C is the thickness of pins 2, and according to the JEDEC standard, is supposed to be in a range of 0.23 mm to 0.32 mm. However, according to the exemplary embodiments and/or exemplary methods of the present invention, thickness C may lie outside this range. The characteristic frequencies of housing 1 are reduced when thickness H of pins 2 is reduced. The characteristic frequencies of housing 1 are increased when thickness C of pins 2 is increased. F is the pin length, that is, the length of the section of pin 2 that protrudes from housing 1, along its center line. Pin length F is measured along the geometric center of the pin, and is not normalized according to the JEDEC standard. Geometric considerations yield that pin length F for housings according to the JEDEC standard is in the range of 2.05 mm to 4.12 mm.

However, according to the exemplary embodiments and/or exemplary methods of the present invention, pin length F may lie outside this range. The characteristic frequencies of housing 1 are lowered if pin length F is increased. The characteristic frequencies of housing 1 are increased when length F of pins 2 is reduced. L is the length of the soldered sections of a pin 2, that is, the lengths of the sections of pins 2 that are soldered to the printed-circuit board.

According to the exemplary embodiments and/or exemplary methods of the present invention, at least one of parameters B of pins 2, thickness H of pins 2 and pin length L of pins 2 is changed in order to reduce or to increase the characteristic frequencies of the housing with respect to a housing according to the JEDEC standard. The parameters may be changed in common, in this context, so that the individual parameters do not have to deviate too much from the standard so as to achieve the desired change in the characteristic frequencies.

Figure 2A:
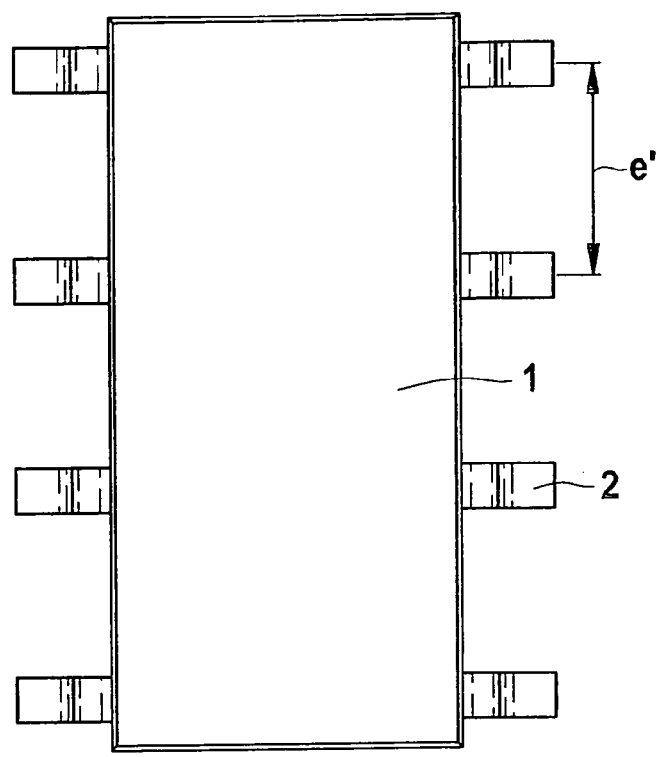
FIG. 2A shows a top view of a housing having twice the pin separation.

FIG. 2A shows a top view of a housing 1 having a double pin separation distance e'. Distance e' between two adjacent pins is twice as great as distance e. In the comparison to FIGS. 1A to 1C, every other pin has been omitted.

Figure 2B:
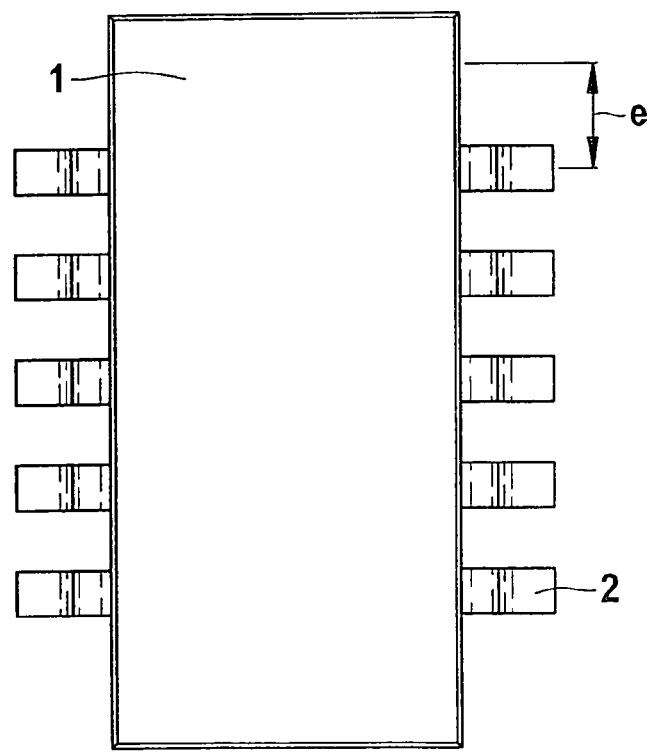
FIG. 2B shows a top view of a housing having pins missing at the opposite ends of the sides.

FIG. 2B shows a top view of a housing 1 which has pins 2 missing at the ends on the opposite sides. Compared, to FIGS. 1A to 1C, at a distance e from outer pins 2, no additional pins are provided, although there would be room for them on the longer sides.

Figure 3A:
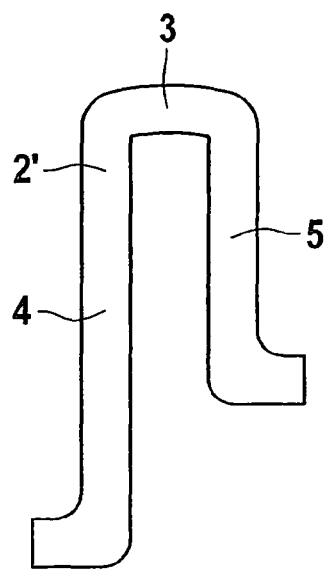
FIG. 3A shows a side view of a pin having a middle bend.

In the following, additional exemplary embodiments of pins will be illustrated which are able to be used alternatively to pins 2 in FIGS. 1A to 2C. FIG. 3A shows a side view of a pin 2', having a middle bend 3 and two side legs 4 and 5. Such a bend makes it possible optionally to increase the pin length. One may also provide a plurality of bends of a zigzag type.

Figure 3B:
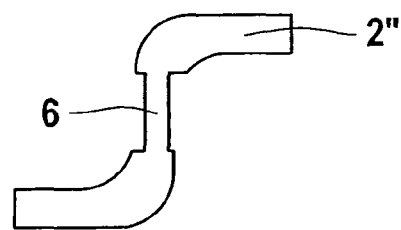
FIG. 3B shows a side view of a pin having a middle region having a reduced cross section.

FIG. 3B shows a side view of a pin 2", having a middle region 6 that has a decreased cross section. In the region having reduced cross section 6, both the width of pin 2" and the thickness of pin 2" are reduced.

Figure 3C:
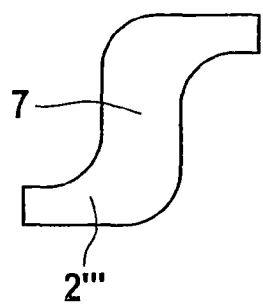
FIG. 3C shows a side view of a pin having a middle region having an enlarged cross section.

FIG. 3C shows a side view of a pin 2''', having a middle region 7 that has an increased cross section. In the middle region, both the width of pin 2''' and the thickness of pin 2''' are increased.

What is claimed is:
1. A housing for a semiconductor component, comprising:
a small outline housing arrangement; and
a plurality of pins provided at an edge of the housing arrangement at distances, each of the plurality of pins having a width, a thickness and a length;
wherein either at least one of the distances lies outside a range of 1.24 mm to 1.30 mm, at least one of the widths lies outside the range of 0.33 mm to 0.51 mm, at least one of the thicknesses lies outside the range of 0.23 to 0.32 mm, or at least one of the lengths lies outside the range of 2.05 to 4.12 mm, to establish suitable characteristic frequencies of the housing.

2. The housing of claim 1, wherein one of the widths is greater than 0.51 mm, and one of the thicknesses is greater than 0.32 mm.

3. The housing of claim 1, wherein one of the lengths is less than 2.05 mm.

4. The housing of claim 1, wherein one of the widths is a width of a broadened section, and one of the thicknesses is a thickness of a thickened section.

5. The housing of claim 1, wherein one of the widths is less than 0.33 mm, and one of the thicknesses is less than 0.23 mm.

6. The housing of claim 5, wherein one of the lengths is greater than 4.12 MM.

7. The housing of claim 6, wherein the pin, which has one of the lengths, has a middle bend.

8. The housing of claim 5, wherein no pin is provided at a distance of 1.24 mm to 1.30 mm on one side of the housing arrangement.

9. The housing of claim 4, wherein one pin is provided at a distance of 2.51 mm to 2.57 mm at the end on one side of the housing arrangement.

10. The housing of claim 5, wherein one of the widths is a width of a thinned section, and one of the thicknesses is a thickness of a narrowed section.

11. The housing of claim 1, wherein the pins are all developed to be the same.

12. The housing of claim 1, wherein one of the widths is greater than 0.55 mm, and one of the thicknesses is greater than 0.35 mm.

13. The housing of claim 1, wherein one of the widths is greater than 0.6 mm, 0.7 mm, 0.8 mm or 1.0mm, and one of the thicknesses is greater than 0.4 mm, 0.5 mm, 0.6 mm, 0.8 mm, 1.0 mm or 1.2 mm.

14. The housing of claim 1, wherein one of the lengths is less than 2.0 mm or 1.8 mm.

15. The housing of claim 1, wherein one of the widths is less than 0.3 mm, 0.25 mm, 0.2 mm, 0.1 mm or 0.05 mm, and one of the thicknesses is less than 0.2 mm, 0.15 mm, 0.1 mm, or 0.05 mm.

16. The housing of claim 5, wherein one of the lengths is greater than 4.2 mm, 4.3 mm, 4.5 mm, 4.7 mm, 5.0 mm, 5.5 mm, mm, 7.0 mm, 8.0 mm, 10.0 mm or 15 mm.

17. The housing of claim 1, wherein the semiconductor component includes a micromechanical acceleration sensor and an integrated circuit.

* * * * *